(12) United States Patent
Haskin (10) Patent No.: US 6,914,617 B2
(45) Date of Patent: Jul. 5, 2005

(54) METHOD FOR DETERMINING WHETHER TWO RECTANGLES OF AN ELECTRONIC CIRCUIT STRUCTURE OVERLAP

(75) Inventor: Bryan Haskin, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 294 days.

(21) Appl. No.: 10/283,776

(22) Filed: Oct. 29, 2002

(65) Prior Publication Data

US 2004/0080519 A1 Apr. 29, 2004

(51) Int. Cl.[7] ............................................. G09G 5/00
(52) U.S. Cl. .................... 345/629; 345/643; 345/636; 345/630; 345/582
(58) Field of Search ............................. 345/629, 643, 345/636, 630, 582

(56) References Cited

U.S. PATENT DOCUMENTS

2002/0105515 A1 * 8/2002 Mochizuki .................. 345/419
2003/0076331 A1 * 4/2003 Deering ...................... 345/581

* cited by examiner

Primary Examiner—Matthew C. Bella
Assistant Examiner—Mike Rahmjoo (57) ABSTRACT

A method of comparing two rectangles of a circuit design structure for overlap is provided. The two rectangles being compared are modified conceptually in such a way as to reduce the amount of computation necessary to determine if the two rectangles overlap. In one embodiment, a first rectangle is reduced in both x- and y-directions to a single point residing in the center of that rectangle, while the size of the second rectangle is expanded in both x- and y-directions by the same amount, resulting in an enlarged rectangle. A determination of whether the single point resides within the enlarged rectangle thus indicates if the two original rectangles overlap. Similarly, in another embodiment, a first rectangle is reduced in the x-direction only, resulting in a y-directed line segment, while a second rectangle is reduced in the y-direction, resulting in an x-directed line segment. The y-directed line segment is extended by the amount that the second rectangle was reduced in the y-direction, and the x-directed line segment is extended by the amount that the first rectangle was reduced in the x-direction. A determination of whether the x-directed line segment and the y-directed line segment intersect indicates if the first and second rectangles overlap.

30 Claims, 6 Drawing Sheets

METHOD FOR DETERMINING WHETHER TWO RECTANGLES OF AN ELECTRONIC CIRCUIT STRUCTURE OVERLAP

BACKGROUND OF THE INVENTION

As a part of the normal integrated circuit (IC) design process, a consistency check of the physical layout of each layer of the IC, including metal layers, semiconductor layers, and the like, is normally performed on the IC design database to detect and correct any mistakes in the design. One of the checks typically performed on such a database is ensuring two adjacent rectangular portions of a layer, such as two metal connections of an IC metal layer, do not overlap. Such a condition often results in two separate circuits of the IC being inadvertently connected together, thus causing improper operation of the IC. Such database checks ordinarily must be performed many thousands of times for each IC due to the large number of transistors and other circuit components normally found in today's integrated circuit technologies. As a result, the amount of time required for each single operation of checking for overlap between two rectangles can significantly influence the overall time required to perform such a check on an entire IC design database.

Typically, checking for possible overlap of two rectangles is performed by iterating over the entire area of each of the rectangles in small sections to determine if any two such sections, one from each of the two rectangles, reside in the same area of the IC layer surface. Such iterations are necessarily time-consuming, causing an inordinate amount of computer processing time to be expended for that particular task.

Alternately, the boundaries of the two rectangles may be determined, and then each line segment defining the boundary of one rectangle may be compared against each line segment of the other rectangle in order to determine if any line segments of opposite rectangles intersect. Additionally, a check must be made to determine if one of the rectangles resides completely within the other, as no line segments of the two rectangles will intersect in that particular case, thereby reducing the usefulness of a simple line intersection check. Although this particular method is likely to be less computationally intensive than the iterative method, a significant amount of computing time is required nonetheless.

From the foregoing, a need exists for a faster method for detecting if two rectangular features of an electronic design structure, such as an IC metal or semiconductor layer, overlap. Such a method would significantly reduce the time required to check each pair of rectangles, thus reducing overall IC design time.

SUMMARY OF THE INVENTION

Embodiments of the invention, to be discussed in detail below, may be described as methods of modifying two rectangles of an electronic circuit structure in such a way as to reduce the amount of computation necessary to determine if the two rectangles overlap. In one embodiment, a first rectangle is reduced in both x- and y-directions to a single point residing in the center of the rectangle, while the size of the second rectangle is expanded in both x- and y-directions by the same amount, resulting in an enlarged rectangle. The problem of determining whether the rectangles overlap is then reduced to a determination of whether the single point representing the first rectangle resides within the enlarged rectangle representing the second original rectangle.

In another embodiment, a first rectangle is reduced in the x-direction only, resulting in a y-directed line segment, while a second rectangle is reduced in the y-direction, resulting in an x-directed line segment. The y-directed line segment is then extended by the amount that the second rectangle was reduced in the y-direction, while the x-directed line segment is extended by the amount that the first rectangle was reduced in the x-direction. Determination of whether the first and second rectangles overlap is then reduced to a determination of whether the x-directed line segment and the y-direct line segment intersect.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

One embodiment of the invention is shown conceptually in FIG. 1 through FIG. 4, while a second embodiment is displayed in a similar fashion in FIG. 6 through FIG. 9. In each of the figures, the sides of the rectangles are aligned parallel and perpendicular to an x-y coordinate system, as indicated by the x- and y-axes denoted in each of the figures.

Figure 1:
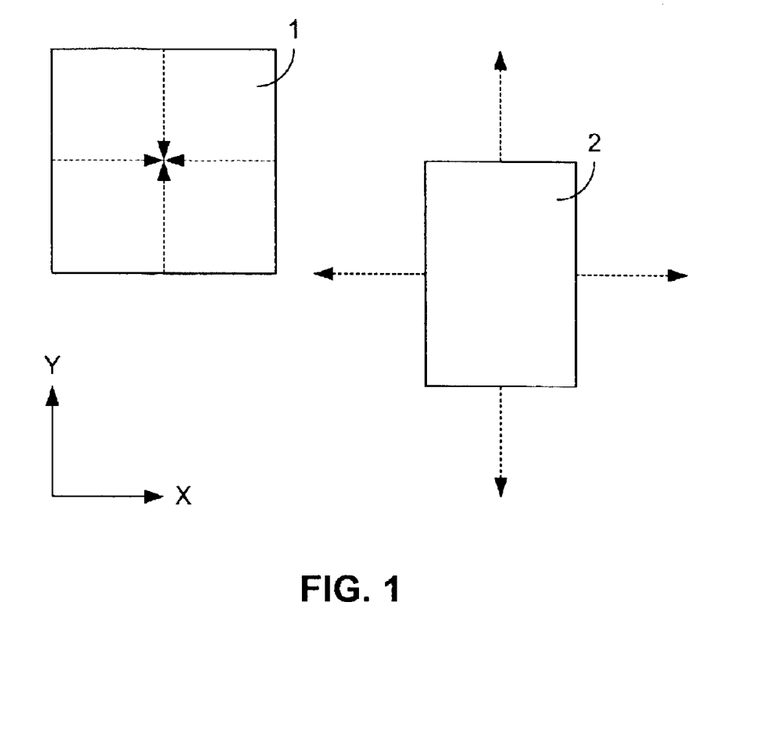
FIG. 1 is a diagram of two non-overlapping rectangles that are to be converted into a single point and an enlarged rectangle, according to an embodiment of the invention.
Figure 2:
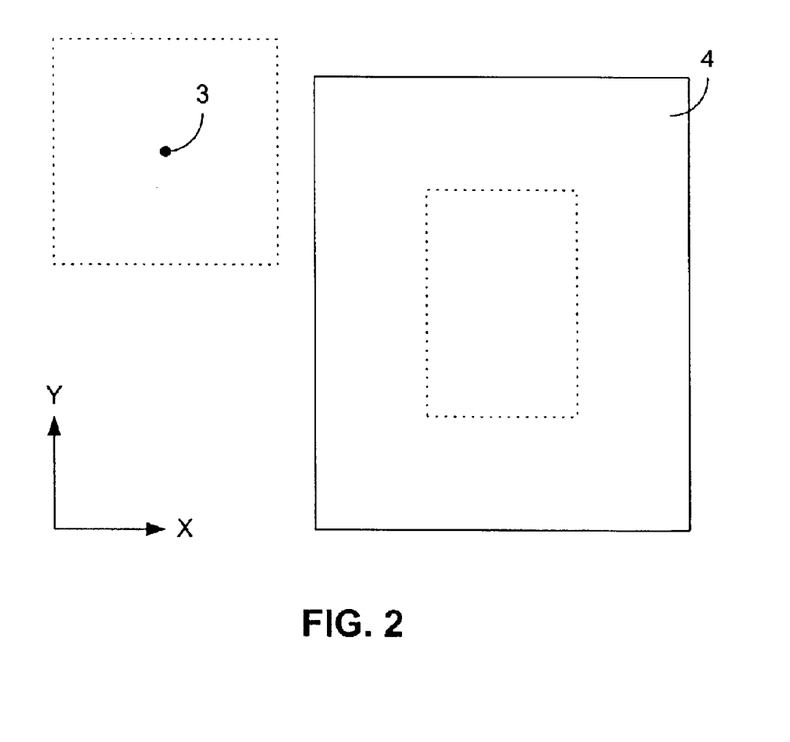
FIG. 2 is a diagram graphically showing the results of the operations indicated in FIG. 1.

Relating to the first embodiment, in FIG. 1 and FIG. 2 a first rectangle 1 and a second rectangle 2 do not overlap. To determine whether the first rectangle 1 and the second rectangle 2 overlap, the first rectangle 1 is reduced along both the x-direction and y-direction, as shown in FIG. 1, from a rectangle to a single point 3, as indicated in FIG. 2. The single point 3 is positioned in the center of the first rectangle 1. This positioning is accomplished by moving opposing sides of the rectangle equal distances toward each other along both the x-axis and the y-axis.

Similarly, the second rectangle 2 is expanded in both the x-direction and y-direction by moving opposing sides of the rectangle outward from the center of the second rectangle 2. Each side of the second rectangle 2 is moved by a distance equal to that which the corresponding sides of the first rectangle 1 were moved in the opposite direction. For example, if each of the two vertical sides of the first rectangle 1 is moved toward the center of the first rectangle 1 along the x-axis by three distance units, each of the vertical sides of the second rectangle 2 are each moved away from the center of the second rectangle 2 by the same distance. The resulting enlarged rectangle 4, as shown in FIG. 2, is centered about the second rectangle 2 of FIG. 1. The arrows of FIG. 1 show the direction and magnitude of the movement for each side of the first rectangle 1 and the second rectangle 2.

FIG. 2 shows the result of the rectangle side movements indicated in FIG. 1. The resulting configuration of the single point 3 and the enlarged rectangle 4 indicate whether the original first rectangle 1 and second rectangle 2 overlap. In the case of FIG. 2, the single point 3 resides outside of the enlarged rectangle 4, indicating that the first rectangle 1 and the second rectangle 2 do not overlap.

Figure 3:
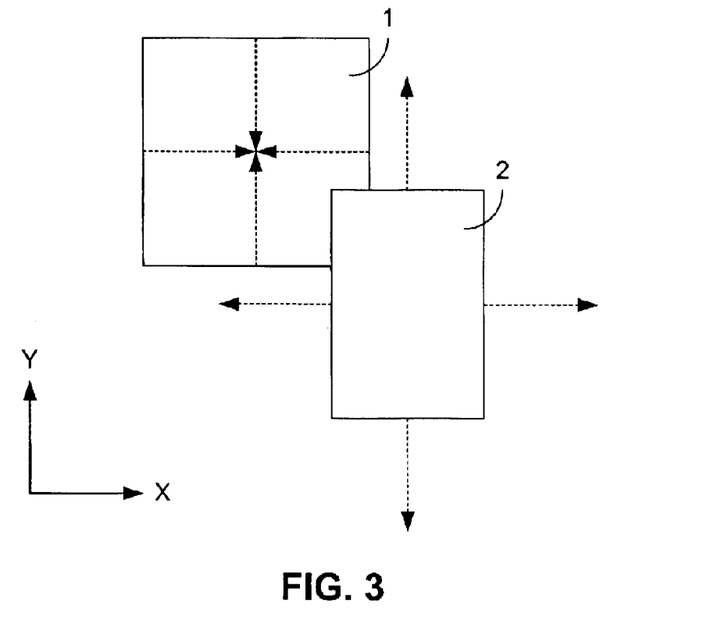
FIG. 3 is a diagram of two overlapping rectangles that are to be converted into a single point and an enlarged rectangle, according to an embodiment of the invention.
Figure 4:
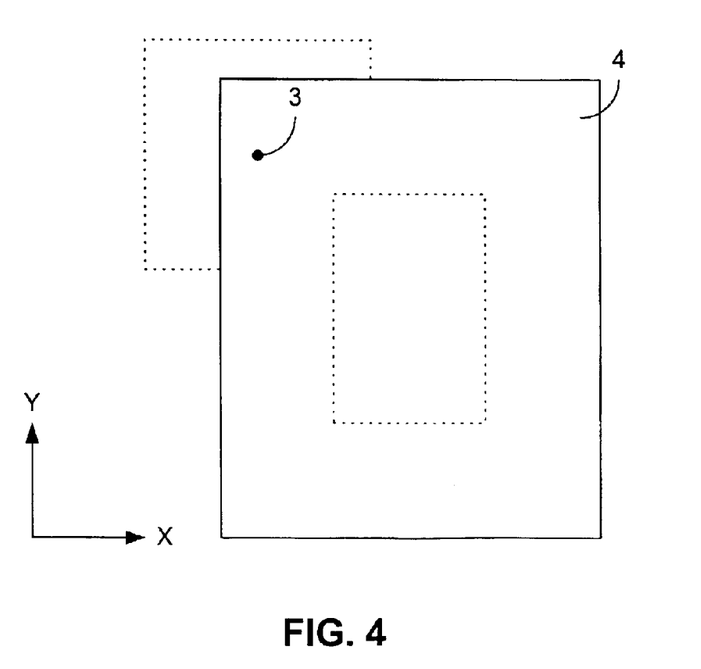
FIG. 4 is a diagram graphically showing the results of the operations indicated in FIG. 3.

FIG. 3 and FIG. 4 describe the situation in which the first rectangle 1 and the second rectangle 2 overlap. The same side movements for each of the rectangles is employed as described above for FIG. 1 and FIG. 2. The resulting positions of the single point 3 and the enlarged rectangle 4, as displayed in FIG. 4, indicate that the original first rectangle 1 and second rectangle 2 overlap in this case, since the single point 3 resides within the enlarged rectangle 4.

Figure 5:
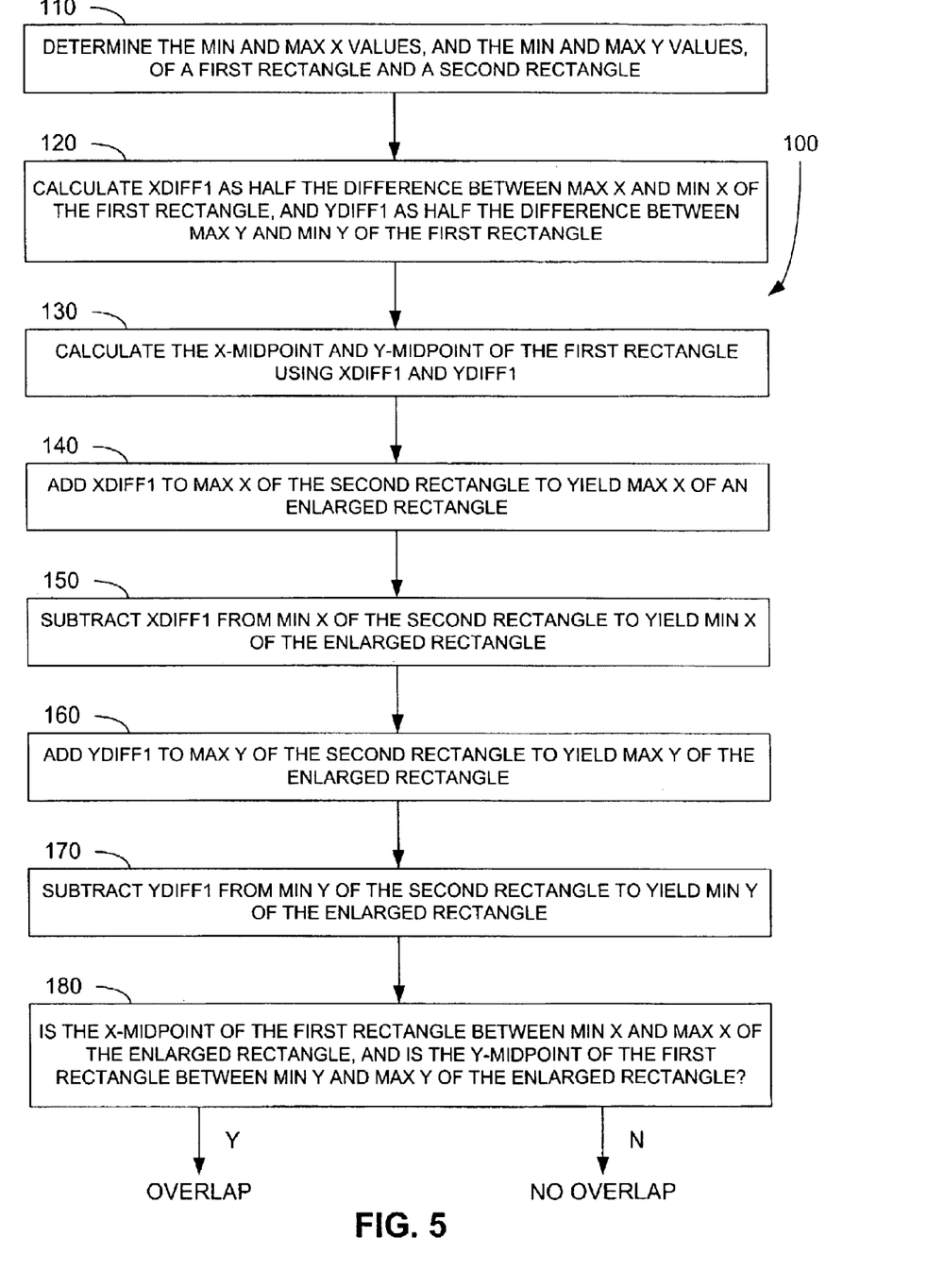
FIG. 5 is a flow diagram of a method according to an embodiment of the invention as depicted in FIG. 1 through FIG. 4.

These conceptual movements of sides of the rectangles are easily accomplished by way of a first computational method 100, as shown in FIG. 5, which is essentially a simple algebraic procedure or algorithm representing these movements. First, the minimum and maximum x values (MIN $x_1$ and MAX $x_1$), as well as the minimum and maximum y values (MIN $y_1$ and MAX $y_1$), for the first rectangle 1, and also the second rectangle 2 (MIN $x_2$, MAX $x_2$, MIN $y_2$ and MAX $y_2$), are determined (step 110). These values may be ascertained quickly, for example, by the x-y coordinate locations of opposing corners of each of the rectangles. Any other method for determining these values would also suffice.

The x-midpoint ($x_{m1}$) and the y-midpoint ($y_{m1}$) of the first rectangle 1, thus defining the single point 3 described above, are then calculated (step 130). Normally, the x-midpoint is ordinarily calculated by first subtracting the minimum x value of the first rectangle 1 from the maximum x value of the first rectangle 1 and then dividing by two to yield an x-difference value between the x-midpoint and one of the opposing vertical sides of the first rectangle 1 ($x_{diff1}$) (step 120). The x-difference value is then added to the minimum x value of the first rectangle 1 to obtain the x-midpoint. Alternately, the x-difference may be subtracted from the maximum x value of the first rectangle 1 to yield the same result. The y-midpoint may be calculated in a corresponding manner. By way of algebraic formulae:

$x_{diff1}$=((MAX $x_1$−MIN $x_1$)/2)

$y_{diff1}$=((MAX $y_1$−MIN $y_1$)/2)

$x_{m1}$=MIN $x_1$+$x_{diff1}$=MAX $x_1$−$x_{diff1}$ $y_{m1}$=MIN $y_1$+$y_{diff1}$=MAX $y_1$−$y_{diff1}$ The x-difference and y-difference values ($x_{diff1}$ and $y_{diff1}$) calculated above are also used to move the sides of the second rectangle 2, resulting in the enlarged rectangle 4 (steps 140 through 170). More specifically, $X_{diff1}$ is added to MAX $x_2$ and subtracted from MIN $x_2$ to define the minimum and maximum x values for the enlarged rectangle 4 (MIN $x_e$ and MAX $x_e$). The minimum and maximum y values for the enlarged rectangle 4 (MIN $y_e$ and MAX $y_e$) are calculated similarly:

MIN $x_e$=MIN $x_2$−$x_{diff1}$

MAX $x_e$=MAX $x_2$+$x_{diff1}$

MIN $y_e$=MIN $y_2$−$y_{diff1}$

MAX $y_e$=MAX $y_2$+$y_{diff1}$

Now that the rectangle conversions have been performed as described earlier, the x-midpoint and y-midpoint values, denoting the location of the single point 3, are compared with the minimum and maximum x and y values of the enlarged rectangle 4 (step 180). If the single point 3 resides within the minimum and maximum x and y values of the enlarged rectangle 4, the first rectangle 1 and the second rectangle 2 overlap. In terms of a comparison formula:

If (MIN $x_e$<$x_{m1}$<MAX $x_e$) and (MIN $y_e$<$y_{m1}$<MAX $y_e$), then the first rectangle 1 and the second rectangle 2 overlap.

Cases where the single point 3 is located directly on the edge of the enlarged rectangle 4, although not strictly representing an overlap condition, indicate that the first rectangle 1 and the second rectangle 2 are "touching," thus possibly representing another undesirable configuration, depending on the particular application involved.

A second embodiment of the invention is described pictorially in FIG. 6 through FIG. 9. With this embodiment, the first rectangle 1 is reduced in the x-direction, as shown in the non-overlapping rectangle case of FIG. 6, resulting in a y-directed line segment 5, passing through and centered upon the first rectangle 1, as displayed in FIG. 7. Conceptually, the vertical sides of the first rectangle 1 are each moved the same distance toward the center of the first rectangle 1. Similarly, the second rectangle 2 is reduced in the y-direction, resulting in an x-directed line segment 6 which passes through and is centered upon the second rectangle 2. Additionally, the length of the y-directed line segment 5 is the length of the first rectangle 1 along the y-axis, plus an additional length added to each end that is equal to the amount that each of the horizontal sides of the second rectangle 2 has been moved in the y-direction. Accordingly, the length of the x-directed segment 6 is the length of the second rectangle 2 along the x-axis, plus the amount that the first rectangle 1 was reduced in the x-direction. The arrows of FIG. 6 indicate the directions and magnitudes of the rectangle side movements described above.

Figure 6:
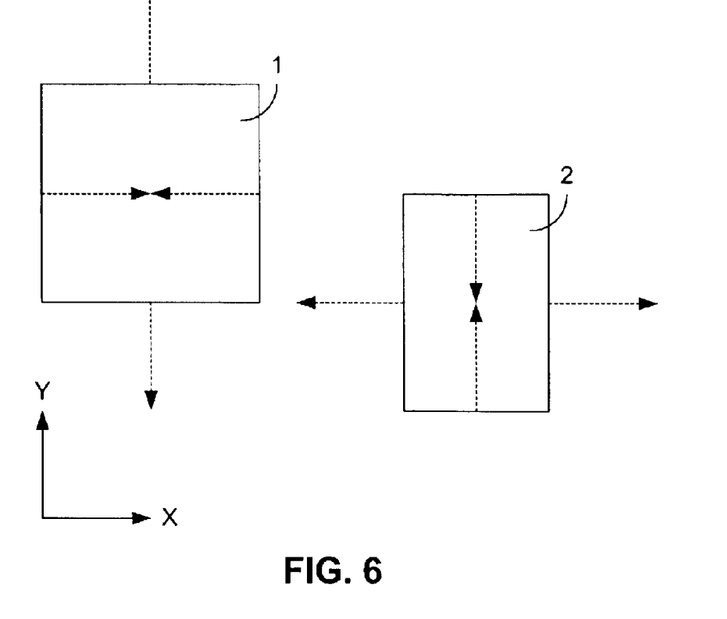
FIG. 6 is a diagram of two non-overlapping rectangles that are to be converted into an x-directed line segment and a y-directed line segment, according to an embodiment of the invention.
Figure 7:
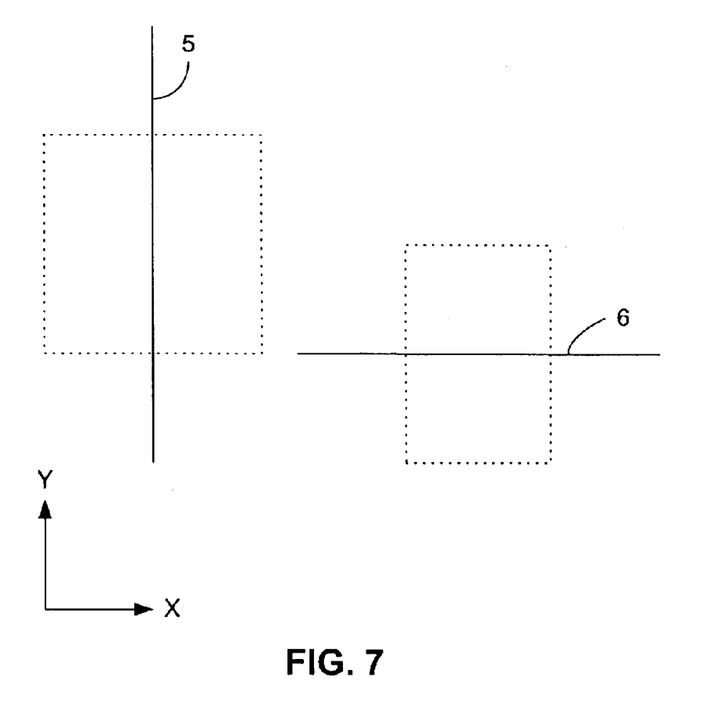
FIG. 7 is a diagram graphically showing the results of the operations indicated in FIG. 6.

FIG. 7 shows the y-directed line segment 5 and the x-directed line segment 6 resulting from the graphical operations indicated in FIG. 6. With this embodiment, the position of the two line segments 5, 6 relative to each other determine if the original rectangles 1, 2 overlap. More specifically, if the two line segments 5, 6 intersect, the rectangles 1, 2 overlap; otherwise, the rectangles 1, 2 occupy separate spaces. In the specific case of FIG. 7, the y-directed line segment 5 and the x-directed line segment 6 do not cross, indicating that the first rectangle 1 and the second rectangle 2 of FIG. 6 do not overlap.

Figure 8:
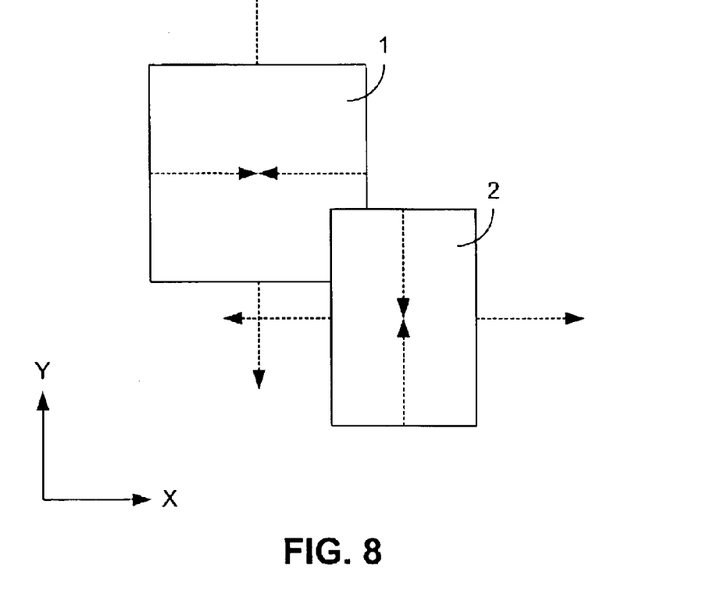
FIG. 8 is a diagram of two overlapping rectangles that are to be converted into an x-directed line segment and a y-directed line segment, according to an embodiment of the invention.
Figure 9:
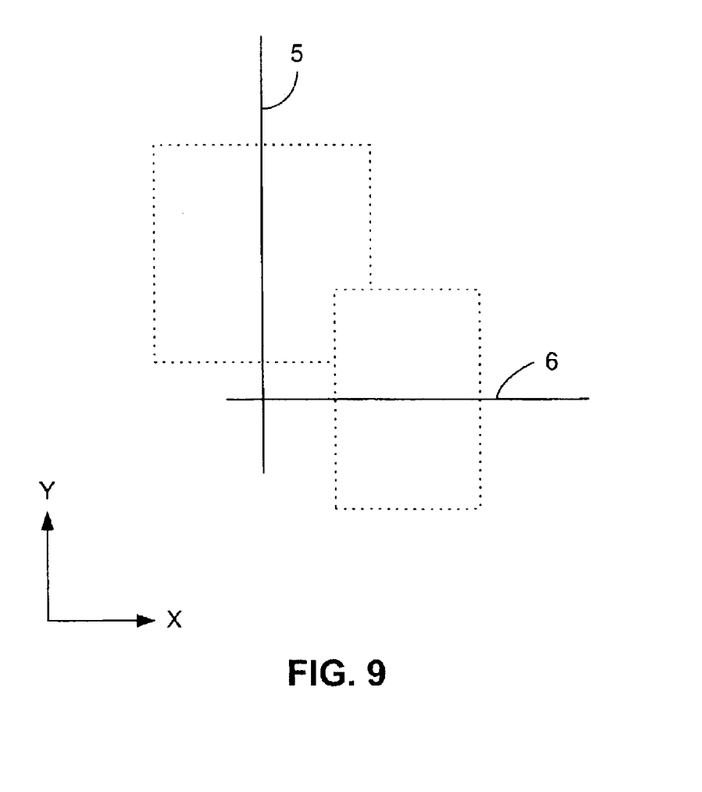
FIG. 9 is a diagram graphically showing the results of the operations indicated in FIG. 8.

The case of two overlapping rectangles is shown in FIG. 8 and FIG. 9. FIG. 8 displays the first rectangle 1 and the second rectangle 2 overlapping, with the same graphical operations performed on them as described in conjunction with FIG. 6. These operations result in an y-directed line segment 5 and an x-directed line segment 6 that intersect, as shown in FIG. 9, thus indicating that the first rectangle 1 and the second rectangle 2 of FIG. 8 overlap.

Figure 10:
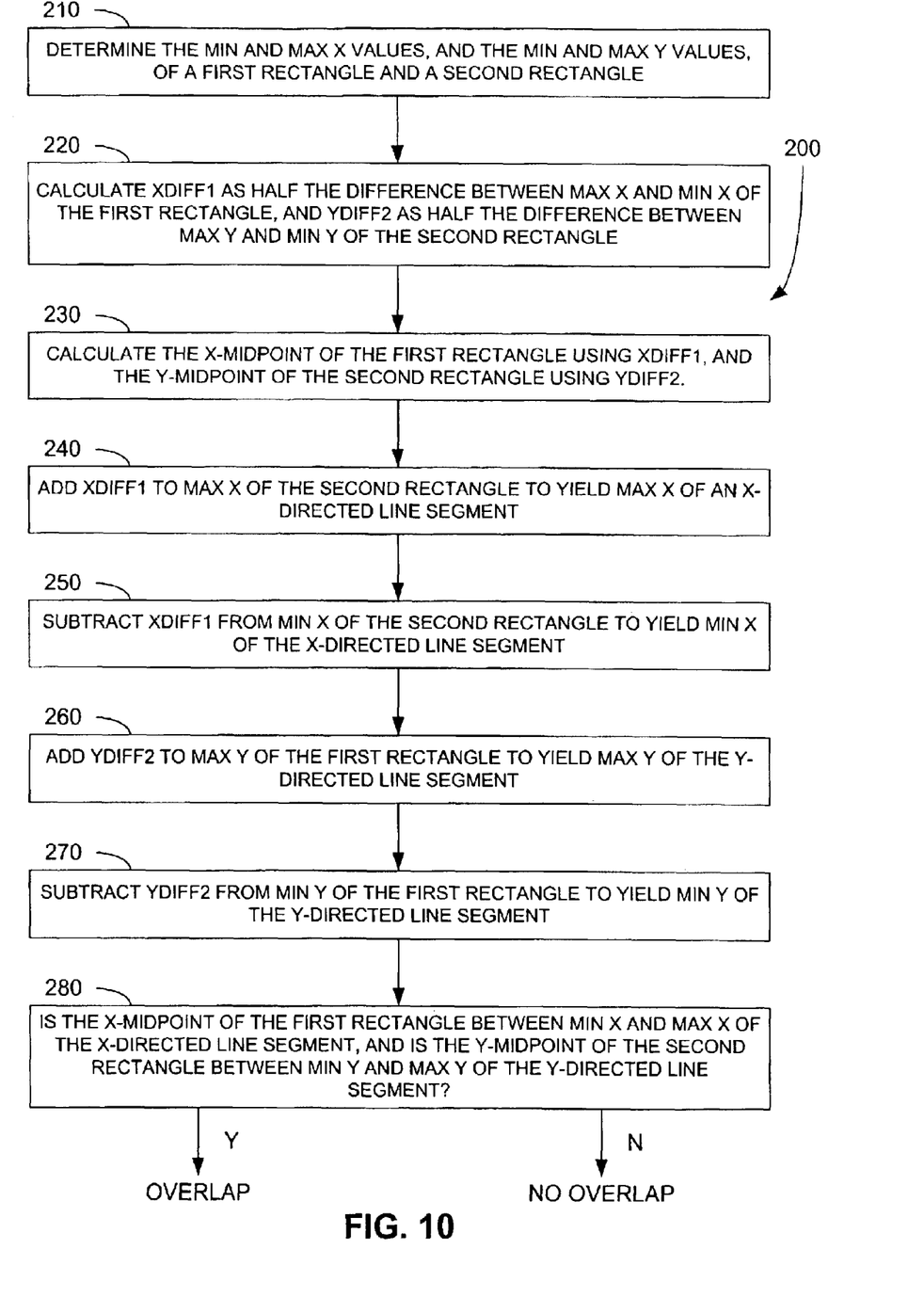
FIG. 10 is a flow diagram of a method according to an embodiment of the invention as depicted in FIG. 6 through FIG. 9.

Once again, these graphical operations may be performed efficiently using a series of concise algebraic operations, as shown in the second computational method 200 of FIG. 10. Identical to the first computational method 100 described earlier, the minimum and maximum x and y values for both the first rectangle 1 (MIN $x_1$, MAX $x_1$, MIN $y_1$, and MAX $y_1$) and the second rectangle 2 (MIN $x_2$, MAX $x_2$, MIN $y_2$, and MAX $y_2$) are determined (step 210). Ordinarily, these values are readily available by way of the x-y coordinates of the corners of the two rectangles 1, 2.

Next, the x-midpoint of the first rectangle 1 ($x_{m1}$) and the y-midpoint of the second rectangle 2 ($y_{m2}$) are calculated (step 230). Normally, the x-midpoint of the first rectangle 1 is calculated by first subtracting the minimum x value of the first rectangle 1 from the maximum x value of the first rectangle 1 and then dividing by two to yield an x-difference value between the x-midpoint and one of the opposing vertical sides of the first rectangle 1 ($x_{diff1}$) (step 220). The x-difference value may then be added to the minimum x value (or subtracted from the maximum x value) of the first rectangle 1 to obtain the x-midpoint for the first rectangle 1. The y-midpoint for rectangle 2 may be calculated in a similar manner by first subtracting the minimum y value of the second rectangle 2 from the maximum y value of the second rectangle 2 and then dividing by two to yield a y-difference value between the y-midpoint and one of the opposing horizontal sides of the second rectangle 2 ($y_{diff2}$) (step 220). The y-difference value is then added to the minimum y value (or subtracted from the maximum y value) of the second rectangle 2 to obtain the y-midpoint for the second rectangle 2 (step 230). Mathematically speaking:

$x_{diff1}=((\text{MAX } x_1-\text{MIN } x_1)/2)$ $y_{diff2}=((\text{MAX } y_2-\text{MIN } y_2)/2)$ $x_{m1}=\text{MIN } x_1+x_{diff1}=\text{MAX } x_1-x_{diff1}$ $y_{m2}=\text{MIN } y_2+y_{diff2}=\text{MAX } y_2-y_{diff2}$ The x-difference and y-difference values ($x_{diff1}$ and $y_{diff2}$) are also employed to move the corresponding sides of the first rectangle 1 and the second rectangle 2 away from their respective rectangle centers, resulting in the y-directed line segment 5 and the x-directed line segment 6 (steps 240 through 270). In greater detail, $x_{diff1}$ is added to MAX $x_2$ and subtracted from MIN $x_2$ to define the minimum and maximum x values for the x-directed line segment 5 (MIN $x_{1s}$ and MAX $x_{1s}$). The minimum and maximum y values for the y-directed line segment (MIN $y_{1s}$ and MAX $y_{1s}$) are calculated correspondingly using $y_{diff2}$:

MIN $x_{1s}$=MIN $x_2-x_{diff1}$

MAX $x_{1s}$=MAX $x_2+x_{diff1}$

MIN $y_{1s}$=MIN $y_1-y_{diff2}$

MAX $y_{1s}$=MAX $y_1+y_{diff2}$

Once again, now that the rectangle conversions have been performed as previously described, the MIN $x_{1s}$ and MAX $x_{1s}$ values, denoting the location of the ends of the x-directed line segment 6, are compared with the x-midpoint of the first rectangle 1 ($x_{m1}$) (step 280). Similarly, the MIN $y_{1s}$ and MAX $y_{1s}$ values, denoting the location of the ends of the y-directed line segment 5, are compared with the y-midpoint of the second rectangle 2 ($y_{m2}$) (also step 280). If the x-midpoint of the first rectangle 1 resides between the ends of the x-directed line segment 6, and the y-midpoint of the second rectangle 2 resides between the ends of the y-directed line segment 5, the first rectangle 1 and the second rectangle 2 overlap. Again, in mathematical terms:

If (MIN $x_{1s}$<$x_{m1}$<MAX $x_{1s}$) and (MIN $y_{1s}$<$y_{m2}$<MAX $y_{1s}$), then the first rectangle 1 and the second rectangle 2 overlap.

Cases where the y-directed line segment 5 and the x-directed line segment 6 intersect at the very end of one of those lines 5, 6, while not strictly construed to be an overlap condition, indicate that the first rectangle 1 and the second rectangle 2 are "touching," thus possibly representing another undesirable configuration of the rectangles 1, 2, depending on the particular situation to which embodiments of the invention are applied.

Aside from a straight-forward application of checking for overlap of two circuit structures, embodiments of the present invention may also be utilized to enforce IC design rules that require specified minimum distances between nearby rectangles of a circuit structure. In such a case, embodiments of the invention may be employed by expanding the actual circuit rectangles by an amount corresponding to the minimum inter-rectangle distance required by the design rules, and then checking to see if the expanded rectangles overlap.

Embodiments of the present invention may also be applied in other areas involving circuit design aside from integrated circuits. For example, printed circuit boards (PCBs) contain similar electronic circuit structures, comprising the one or more layers of those PCBs. Overlap of the rectangular elements, such as circuit traces, within these structures in the PCB design database often raises concerns analogous to those encountered with respect to IC design. As a result, use of embodiments of the invention may be employed within the PCB design environment to significant advantage.

From the foregoing, the invention provides streamlined methods for determining if two rectangles, as part of a larger electronic circuit structure, overlap. The methods can be performed using a modicum of memory storage and processing time compared to prior art methods. Embodiments of the invention other than those shown above are also possible. As a result, the invention is not to be limited to the specific forms so described and illustrated; the invention is limited only by the claims.

What is claimed is:

1. A method for determining whether a first rectangle and a second rectangle of an electronic circuit structure overlap, the first rectangle and the second rectangle being aligned along an x-y coordinate system having an x-axis and a y-axis, the method comprising:

determining the minimum x value and the minimum y value of the first rectangle and the second rectangle;

calculating half the difference between the minimum x value of the first rectangle and the maximum x value of the first rectangle to yield an x-difference;

calculating half the difference between the minimum y value of the first rectangle and the maximum y value of the first rectangle to yield a difference;

employing the x-difference to yield the x-midpoint of the first rectangle;

employing the y-difference to yield the y-midpoint of the first rectangle;

adding the x-difference to the maximum x value of the second rectangle to yield the maximum x value of an enlarged rectangle;

subtracting the x-difference from the minimum x value of the second rectangle to yield the minimum x value of the enlarged rectangle;

adding the y-difference to the maximum y value of the second rectangle to yield the maximum y value of an enlarged rectangle;

subtracting the y-difference from the minimum y value of the second rectangle to yield the minimum y value of the enlarged rectangle; and determining whether the x-midpoint of the first rectangle lies between the minimum x value of the enlarged rectangle and the maximum x value of the enlarged rectangle, and whether the y-midpoint of the first rectangle lies between the minimum y value of the enlarged rectangle and the maximum y value of the enlarged rectangle, thus indicating that the first rectangle and the second rectangle overlap.

2. The method of claim 1, wherein the x-difference employing step comprises adding the x-difference to the minimum x value of the first rectangle.

3. The method of claim 1, wherein the x-difference employing step comprises subtracting the x-difference from the maximum x value of the first rectangle.

4. The method of claim 1, wherein the y-difference employing step comprises adding the y-difference to the minimum y value of the first rectangle.

5. The method of claim 1, wherein the y-difference employing step comprises subtracting the y-difference from the maximum y value of the first rectangle.

6. A method for determining whether a first rectangle and a second rectangle of an electronic circuit structure overlap, the first rectangle and the second rectangle being aligned along an x-y coordinate system having an x-axis and a y-axis, the method comprising:

determining the minimum x value and the minimum y value of the first rectangle and the second rectangle;

calculating half the difference between the minimum x value of the first rectangle and the maximum x value of the first rectangle to yield an x-difference;

calculating half the difference between the minimum y value of the second rectangle and the maximum y value of the second rectangle to yield a y-difference;

employing the x-difference to yield the x-midpoint of the first rectangle;

employing the y-difference to yield the y-midpoint of the second rectangle;

adding the x-difference to the maximum x value of the second rectangle to yield the maximum x value of an x-directed line segment;

subtracting the x-difference from the minimum x value of the second rectangle to yield the minimum x value of the x-directed line segment;

adding the y-difference to the maximum y value of the first rectangle to yield the maximum y value of a y-directed line segment;

subtracting the y-difference from the minimum y value of the first rectangle to yield the minimum y value of the y-directed line segment; and determining whether the x-midpoint of the first rectangle lies between the minimum x value of the x-directed line segment and the maximum x value of the x-directed line segment, and whether the y-midpoint of the second rectangle lies between the minimum y value of the y-directed line segment and the maximum y value of the y-directed line segment, thus indicating that the first rectangle and the second rectangle overlap.

7. The method of claim 6, wherein the x-difference employing step comprises adding the x-difference to the minimum x value of the first rectangle.

8. The method of claim 6, wherein the x-difference employing step comprises subtracting the x-difference from the maximum x value of the first rectangle.

9. The method of claim 6, wherein the y-difference employing step comprises adding the y-difference to the minimum y value of the second rectangle.

10. The method of claim 6, wherein the y-difference employing step comprises subtracting the y-difference from the maximum y value of the second rectangle.

11. A computer system for determining whether a first rectangle and a second rectangle of an electronic circuit structure overlap, the first rectangle and the second rectangle being aligned along an x-y coordinate system having an x-axis and a y-axis, the computer system comprising:

means for determining the minimum x value and the minimum y value of the first rectangle and the second rectangle;

means for calculating half the difference between the minimum x value of the first rectangle and the maximum x value of the first rectangle to yield an x-difference;

means for calculating half the difference between the minimum y value of the first rectangle and the maximum y value of the first rectangle to yield a y-difference;

means for employing the x-difference to yield the x-midpoint of the first rectangle;

means for employing the y-difference to yield the y-midpoint of the first rectangle;

means for adding the x-difference to the maximum x value of the second rectangle to yield the maximum x value of an enlarged rectangle;

means for subtracting the x-difference from the minimum x value of the second rectangle to yield the minimum x value of the enlarged rectangle;

means for adding the y-difference to the maximum y value of the second rectangle to yield the maximum y value of an enlarged rectangle;

means for subtracting the y-difference from the minimum y value of the second rectangle to yield the minimum y value of the enlarged rectangle; and means for determining whether the x-midpoint of the first rectangle lies between the minimum x value of the enlarged rectangle and the maximum x value of the enlarged rectangle, and whether the y-midpoint of the first rectangle lies between the minimum y value of the enlarged rectangle and the maximum y value of the enlarged rectangle, thus indicating that the first rectangle and the second rectangle overlap.

12. The computer system of claim 11, wherein the x-difference employing means comprises adding the x-difference to the minimum x value of the first rectangle.

13. The computer system of claim 11, wherein the x-difference employing mean comprises subtracting the x-difference from the maximum x value of the first rectangle.

14. The computer system of claim 11, wherein the y-difference employing means comprises adding the y-difference to the minimum y value of the first rectangle.

15. The computer system of claim 11, wherein the y-difference employing means comprises subtracting the y-difference from the maximum y value of the first rectangle.

16. A computer system for determining whether a first rectangle and a second rectangle of an electronic circuit structure overlap, the first rectangle and the second rectangle being aligned along an x-y coordinate system having an x-axis and a y-axis, the computer system comprising:
 means for determining the minimum x value and the minimum y value of the first rectangle and the second rectangle;
 means for calculating half the difference between the minimum x value of the first rectangle and the maximum x value of the first rectangle to yield an x-difference;
 means for calculating half the difference between the minimum y value of the second rectangle and the maximum y value of the second rectangle to yield a y-difference;
 means for employing the x-difference to yield the x-midpoint of the first rectangle;
 means for employing the y-difference to yield the y-midpoint of the second rectangle;
 means for adding the x-difference to the maximum x value of the second rectangle to yield the maximum x value of an x-directed line segment;
 means for subtracting the x-difference from the minimum x value of the second rectangle to yield the minimum x value of the x-directed line segment;
 means for adding the y-difference to the maximum y value of the first rectangle to yield the maximum y value of a y-directed line segment;
 means for subtracting the y-difference from the minimum y value of the first rectangle to yield the minimum y-value of the y-directed line segment; and
 means for determining whether the x-midpoint of the first rectangle lies between the minimum x value of the x-directed line segment and the maximum x value of the x-directed line segment, and whether the y-midpoint of the second rectangle lies between the minimum y value of the y-directed line segment and the maximum y value of the y-directed line segment, thus indicating that the first rectangle and the second rectangle overlap.

17. The computer system of claim 16, wherein the x-difference employing means comprises adding the x-difference to the minimum x value of the first rectangle.

18. The computer system of claim 16, wherein the x-difference employing means comprises subtracting the x-difference from the maximum x value of the first rectangle.

19. The computer system of claim 16, wherein the y-difference employing means comprises adding the y-difference to the minimum y value of the second rectangle.

20. The computer system of claim 16, wherein the y-difference employing means comprises subtracting the y-difference from the maximum y value of the second rectangle.

21. A program storage medium readable by a computer system, embodying a program executable by the computer system to perform method steps for determining whether a first rectangle and a second rectangle of an electronic circuit structure overlap, the first rectangle and the second rectangle being aligned along an x-y coordinate system having an x-axis and a y-axis, the method steps comprising:
 determining the minimum x value and the minimum y value of the first rectangle and the second rectangle;
 calculating half the difference between the minimum x value of the first rectangle and the maximum x value of the first rectangle to yield an x-difference;
 calculating half the difference between the minimum y value of the first rectangle and the maximum y value of the first rectangle to yield a y-difference;
 employing the x-difference to yield the x-midpoint of the first rectangle;
 employing the y-difference to yield the y-midpoint of the first rectangle;
 adding the x-difference to the maximum x value of the second rectangle to yield the maximum x value of an enlarged rectangle;
 subtracting the x-difference from the minimum x value of the second rectangle to yield the minimum x value of the enlarged rectangle;
 adding the y-difference to the maximum y value of the second rectangle to yield the maximum y value of an enlarged rectangle;
 subtracting the y-difference from the minimum y value of the second rectangle to yield the minimum y value of the enlarged rectangle; and
 determining whether the x-midpoint of the first rectangle lies between the minimum x value of the enlarged rectangle and the maximum x value of the enlarged rectangle, and whether the y-midpoint of the first rectangle lies between the minimum y value of the enlarged rectangle and the maximum y value of the enlarged rectangle, thus indicating that the first rectangle and the second rectangle overlap.

22. The program storage medium of claim 21, wherein the x-difference employing step comprises adding the x-difference to the minimum x value of the first rectangle.

23. The program storage medium of claim 21, wherein the x-difference employing step comprises subtracting the x-difference from the maximum x value of the first rectangle.

24. The program storage medium of claim 21, wherein the y-difference employing step comprises adding the y-difference to the minimum y value of the first rectangle.

25. The program storage medium of claim 21, wherein the y-difference employing step comprises subtracting the y-difference from the maximum y value of the first rectangle.

26. A program storage medium readable by a computer system, embodying a program executable by the computer system to perform method steps for determining whether a first rectangle and a second rectangle of an electronic circuit structure overlap, the first rectangle and the second rectangle being aligned along an x-y coordinate system having an x-axis and a y-axis, the method steps comprising:
 determining the minimum x value and the minimum y value of the first rectangle and the second rectangle;
 calculating half the difference between the minimum x value of the first rectangle and the maximum x value of the first rectangle to yield an x-difference;
 calculating half the difference between the minimum y value of the second rectangle and the maximum y value of the second rectangle to yield a y-difference;

employing the x-difference to yield the x-midpoint of the first rectangle;

employing the y-difference to yield the y-midpoint of the second rectangle;

adding the x-difference to the maximum x value of the second rectangle to yield the maximum x value of an x-directed line segment subtracting the x-difference from the minimum x value of the second rectangle to yield the minimum x value of the x-directed line segment;

adding the y-difference to the maximum y value of the first rectangle to yield the maximum y value of a y-directed line segment;

subtracting the y-difference from the minimum y value of the first rectangle to yield the minimum y value of the y-directed line segment; and determining whether the x-midpoint of the first rectangle lies between the minimum x value of the x-directed line segment and the maximum x value of the x-directed line segment, and whether the y-midpoint of the second rectangle lies between the minimum y value of the y-directed line segment and the maximum y value of the y-directed line segment, thus indicating that the first rectangle and the second rectangle overlap.

27. The program storage medium of claim 26, wherein the x-difference employing step comprises adding the x-difference to the minimum x value of the first rectangle.

28. The program storage medium of claim 26, wherein the x-difference employing step comprises subtracting the x-difference from the maximum x value of the first rectangle.

29. The program storage medium of claim 26, wherein the y-difference employing step comprises adding the y-difference to the minimum y value of the second rectangle.

30. The program storage medium of claim 26, wherein the y-difference employing step comprises subtracting the y-difference from the maximum y value of the second rectangle.

* * * * *